United States Patent [19]

Esch et al.

[11] 3,899,372

[45] Aug. 12, 1975

[54] PROCESS FOR CONTROLLING INSULATING FILM THICKNESS ACROSS A SEMICONDUCTOR WAFER

[75] Inventors: Ronald Philip Esch; Patrick Chin-Sheng Huang, both of Manassas, Va.

[73] Assignee: International Business Machines Corporation, Armonk, N.Y.

[22] Filed: Oct. 31, 1973

[21] Appl. No.: 411,518

[52] U.S. Cl. ...................... 148/187; 29/571; 156/17

[51] Int. Cl. ............................................ H01l 7/44

[58] Field of Search .............. 148/187, 186; 29/571; 156/17

[56] References Cited

UNITED STATES PATENTS

| | | | |
|---|---|---|---|
| 3,473,093 | 10/1969 | Bilous et al. | 148/187 |
| 3,534,234 | 10/1970 | Clevenger | 148/186 X |
| 3,756,876 | 9/1973 | Brown et al. | 148/187 X |

OTHER PUBLICATIONS

Appels et al., "Local Oxidation of Silicon ——etc.," Philips Res. Repts. Vol. 25, 1970, pp. 118–132.

*Primary Examiner*—L. Dewayne Rutledge
*Assistant Examiner*—J. M. Davis
*Attorney, Agent, or Firm*—Joseph C. Redmond, Jr.

[57] ABSTRACT

The invention is a process of fabricating semiconductor devices including an insulating film across the surface that has a planar configuration. Alternatively, the film may be of uniform thickness and non-planar configuration. Both the planar and uniform thickness characteristics of the insulating film permit openings to be formed therein without over etching a defined surface area and conductors to be formed thereon without broadening. An important feature of the invention is utilizing the differential growth rate of films on semiconductor surfaces and/or selection of a suitable initial film thickness as a diffusion mask. The initial film thickness also contributes to a planar or uniform film thickness or other configuration across the device.

9 Claims, 19 Drawing Figures

PRIOR ART

PROCESS FOR CONTROLLING INSULATING FILM THICKNESS ACROSS A SEMICONDUCTOR WAFER

BACKGROUND OF THE INVENTION

1. Field of the Invention

This invention relates to the fabrication of semiconductor devices, and more particularly to a method of providing planar or uniform or selected thicknesses of an insulating film across a semiconductor wafer whereby the film serves as (1) a diffusion mask, (2) a passivating film, and/or (3) support means for a conductive member.

2. Description of the Prior Art

Planar processing of semiconductor wafers as integrated circuits employs an insulating film, typically silicon dioxide as a diffusion mask; passivating film, and/or support for an electrical conductor. The insulating film is formed on the surface of a semiconductor wafer by suitable processes, e.g., thermal growth, pyrolytic, anodization and the like. Openings are formed in the film by conventional photolithographic — masking — etching processes. Impurities are diffused through the openings to convert the semiconductor wafer to a different conductivity type. The insulating film is regrown simultaneously or subsequently to the impurity diffusion. Other openings are made in the regrown film for gate insulation formation; emitter diffusions or metal contact to the diffused regions.

The growing and regrowing of the insulating film normally produces an irregular or non-planar surface across the surface of the wafer. Several problems are created by the irregular or non-planar insulating film surface. One problem is that an irregular or non-planar surface introduces resolution problems in the photolithographic - masking processes. Metallized conductors formed on the insulating film have different widths across their surface or are broadened due to different photoresist development. To prevent conductors from broadening to the point where they short circuit, extra spacing or tolerances are associated with each conductor. Tolerances take up area in the wafer which reduces the number of devices that may be formed in the wafer.

Another problem is that the different thicknesses of insulation across the wafer causes over etching during the formation of openings. In the case of field effect transistors (FET), the diffused (source/drain) regions are exposed during the gate formation. The result is the metal gate formed in the gate area extends over the diffused region which noticeably increases the gate capacitance. The electrical characteristic of the device is significantly altered by such construction.

One technique for achieving an insulating film with a more regular surface is described in an article entitled "Planox Process Smoothes Path to Greater MOS Density" by F. Morandi which is described in "Electronics", Dec. 20,1971, pages 44-48. The Planox process employs silicon nitride and silicon dioxide in combination as an insulating film. However, the Planox process only achieves a partial planar surface (see FIG. 3, Morandi reference, supra) not an entire planar surface over the substrate or wafer. Etching and conductor broadening problems are not eliminated by the Planox process. Moreover, the Planox process introduces additional processing steps and materials, i.e., silicon nitride relative to the normal planar — silicon dioxide process. The additional processing steps introduce other reliability and cost problems.

Another film planarization technique is described in Ser. No. 375,298 filed June 29, 1973, assigned to the same assignee as that of the present invention. Ser. no. 375,298, however, relates to sputtered film and not thermally grown film as in the present case. Moreover, the film is only partially planarized whereas the film in the present invention is fully planarized across the substrate.

The usual prior art practice for correcting the conductor broadening is by improved mask resolution. Mask resolution is improved by employing (1) photoresist that is more responsive to light and/or (2) optical equipment that produces a greater light penetration into the photoresist. In the case of over etching, the usual prior art practice is to provide a tolerance to prevent the etch from adversely affecting the adjacent diffusion regions.

As a large scale integration incorporates more and more function into a semiconductor device, however, the area available to a circuit must be utilized more efficiently. Improving device dimensional control in both horizontal and vertical directions will achieve the objective of greater density, reliability and function in large scale integration.

An object of the present invention is a process that controls insulating film thickness across a semiconductor wafer to improve device density, yield and reliability.

Another object is a process for achieving an insulating film having a planar surface or uniform thickness entirely across a semiconductor wafer employed in the manufacture of unipolar and bipolar semiconductor devices.

Another object is a process for achieving a planar insulating film of silicon dioxide entirely across a semiconductor wafer.

One specific object is a process to prevent over etching of gate regions during the fabrication of FET devices.

Another specific object is preventing or eliminating conductor line broadening during the fabrication of semoconductor devices.

SUMMARY OF THE INVENTION

An article by W. A. Pliskin, IBM Journal of Research and Development, pages 198 to 205, Volume 10, May 1966, discloses that silicon dioxide has different growth rates according to the surface on which it is formed. The article indicates that the growth rate of silicon dioxide on highly doped silicon, e.g., boron or phosphorous is greater than that on intrinsic or oxide coated surfaces of silicon. The present invention recognizes that the differential growth rate characteristic of insulating film, e.g., silicon dixode on semiconductor wafers may be conveniently employed to control the insulating film thickness and planarity across the wafer. Any thickness or film planarity may be described by a series of equations, each describing a film growth. The equations may be solved simultaneously for a common thickness or planarity. A key parameter in the equation is the initial or starting thickness of the film. Selecting a suitable initial film thickness; surface composition and growth rate enables the final film thickness across the wafer to present a planar surface or be of uniform or selected thickness. Planar film surfaces, in particular, provide improved conductor resolution, eliminate over etching and achieve increased density, yield and reliability.

One feature of the invention is the selection of an initial insulating film thickness that is of a composition that will mask out impurity diffusants and provide a surface for the regrowth of the film at a differential rate relative to other areas of the wafer.

Another feature is forming an insulating film on a diffused region to have a greater growth rate than that for an intrinsic or film covered semiconductor.

Still another feature is a diffusion — oxidation cycle that minimizes diffusion drive-in while selectively controlling the reformation of the oxide on the wafer surface.

In an illustrative embodiment, the process comprises the steps of growing an insulating film, typically silicon dioxide on the surface of a semiconductor substrate, typically silicon of a first conductivity type. Openings are formed in the insulating film by photolithographic — masking — etching processes to establish source/-drain or base regions for one or more transistors in the substrate. Impurities are diffused through the openings to change the conductivity of the semiconductor substrate. The surface of the insulating film and the semiconductor becomes doped with the impurity during diffusion. In the case of phosphorus as an impurity, a phosphosilicate glass is formed on the oxide film. The phosphorus forms a diffusion source in the silicon exposed in the opening. The impurity is thermally driven into the substrate to form a barrier or diffused region. The oxide is reformed in the opening and under the initial oxide during drive-in. Typically, the drive-in cylce comprises 5 minutes of dry oxygen; 125 minutes of wet steam and a final 5 minutes of dry oxygen at a temperature of about 1000°C. The oxide grows at a faster rate on the phosphorus doped — silicon area than on the phosphorus doped — oxide coated area. Depending upon the drive-in cycle and the initial oxide thickness, the final oxide coating across the wafer forms a planar surface. Also the oxide thickness of the diffused region is equal to or greater than the oxide thickness over the remaining portions of the wafer. The thickness of the oxide over the diffused regions is sufficient to prevent exposure thereof when the oxide is etched or removed between the diffused regions in forming a gate area for a field effect transistor (FET) or an emitter area for a bipolar transistor. Accordingly, there is little to no lateral extension of the gate geometries over the diffused regions in an FET. The base region is not reduced in a bipolar transistor. The surface of the oxide eliminates mask resolution problems. Conductors may be formed on each device at closer spacing due to the elimination of line broadening.

BRIEF DESCRIPTION OF THE DRAWINGS

The invention and its further objects and features will be more fully understood from the following detailed description taken in conjunction with the drawing in which.

Figure 1:
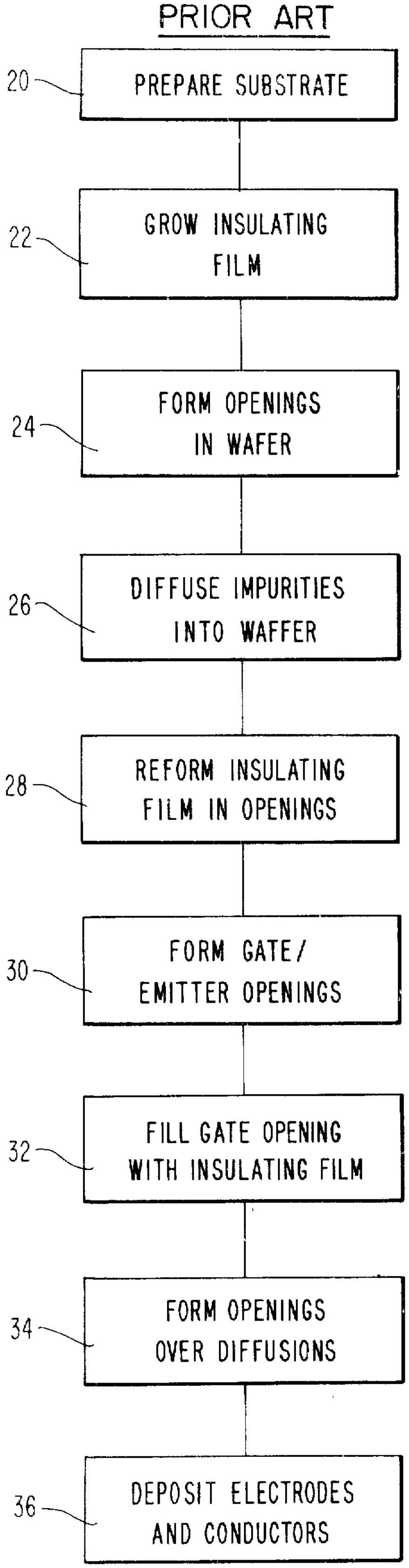
FIG. 1 is a flow diagram describing a prior art process for fabricating semiconductor devices.

It will be understood that although the following processes are described in terms of a single element, the steps of the process may be performed upon an entire wafer which subsequently is divided into several hundred single elements.

DETAILED DESCRIPTION

Referring to FIGS. 1 and 2A through 2F, an operation 20 suitably processes a monocrystalline semiconductor wafer 120 as a substrate for a plurality of semiconductor devices. In one form, the starting substrate is a silicon wafer having a P type impurity concentration of $7.5 \times 10^{15}$ and sheet resistivity of 2 ohm-cm. The wafer 120 is suitably lapped, polished and etched in the operation 20 to ready a surface for an initial insulating film 122 (see FIG. 2A).

The initial film 122 is formed or deposited on the surface in an operation 22. For a silicon substrate, the film 122 is an oxide formed on the surface by thermal growth, pyrolytic deposition, anodization and the like. Details for depositing oxide films on substrates are well know in the prior art and need not be described herein. Typically, the oxide film is deposited or formed to a thickness of about 5400 A.

An operation 24 forms openings 123 (see FIG. 2B) in the film 122 by conventional photolithographic — masking — etching processes. Impurities are diffused through the openings and into the substrate 120 in an operation 26. The impurities alter the wafer conductivity type to a second or different type in the area of the openings 123. One impurity that is diffused into P type substrates is phosphorus. Details for diffusing phosphorus and other impurities into the wafer are given in U.S. Pat. No. 3,508,209, assigned to the same assignee as that of the present invention. The phosphorus combines with the oxide film 122 as well as in the exposed silicon area in the substrate 120. The phosphorus doped silicon area in the openings 123 serves as a diffusion source for formation of a barrier or diffused region 124 (see FIG. 2C).

An operation 28 reforms oxide in the openings 123 as well as below film 122. The former oxide is defined as field oxide 125 and the latter oxide is defined as diffused oxide 127. Typically, the oxide is reformed by introducing oxygen into a chamber in which the substrate or wafer 120 is heated to a temperature of about 1000°C. The wafer is exposed to dry oxygen for about 5 minutes. The chamber is evacuated and wet steam is introduced for a period of 58 minutes. Thereafter, dry oxygen is reintroduced for another 5 minutes. During this thermal cycle, the impurities are driven into the substrate 120 to form a PN junction 129. The diffusion depth is approximately 70 microinches, as shown in FIG. 2C.

The silicon wafer is converted to silicon dioxide during the thermal cycle. The field oxide and diffused oxide commence to grow. The thermal cycle achieves a diffusion oxide thickness of approximately 5400 A in the openings 123. The field oxide 125 is increased in thickness from 5400 A to approximately 7400 A. A silicon dioxide step 130 is created between the field and diffused oxides of approximately 3500 A. Also a silicon step 131 is created in the substrate by the portion of the region 127 beneath the surface of the silicon wafer 120. This silicon step is approximately 1500 A.

Figures 2A, 2B, 2C, 2D, 2E, 2F, 4A, 4B, 4C, 4D, 4E, 4F:
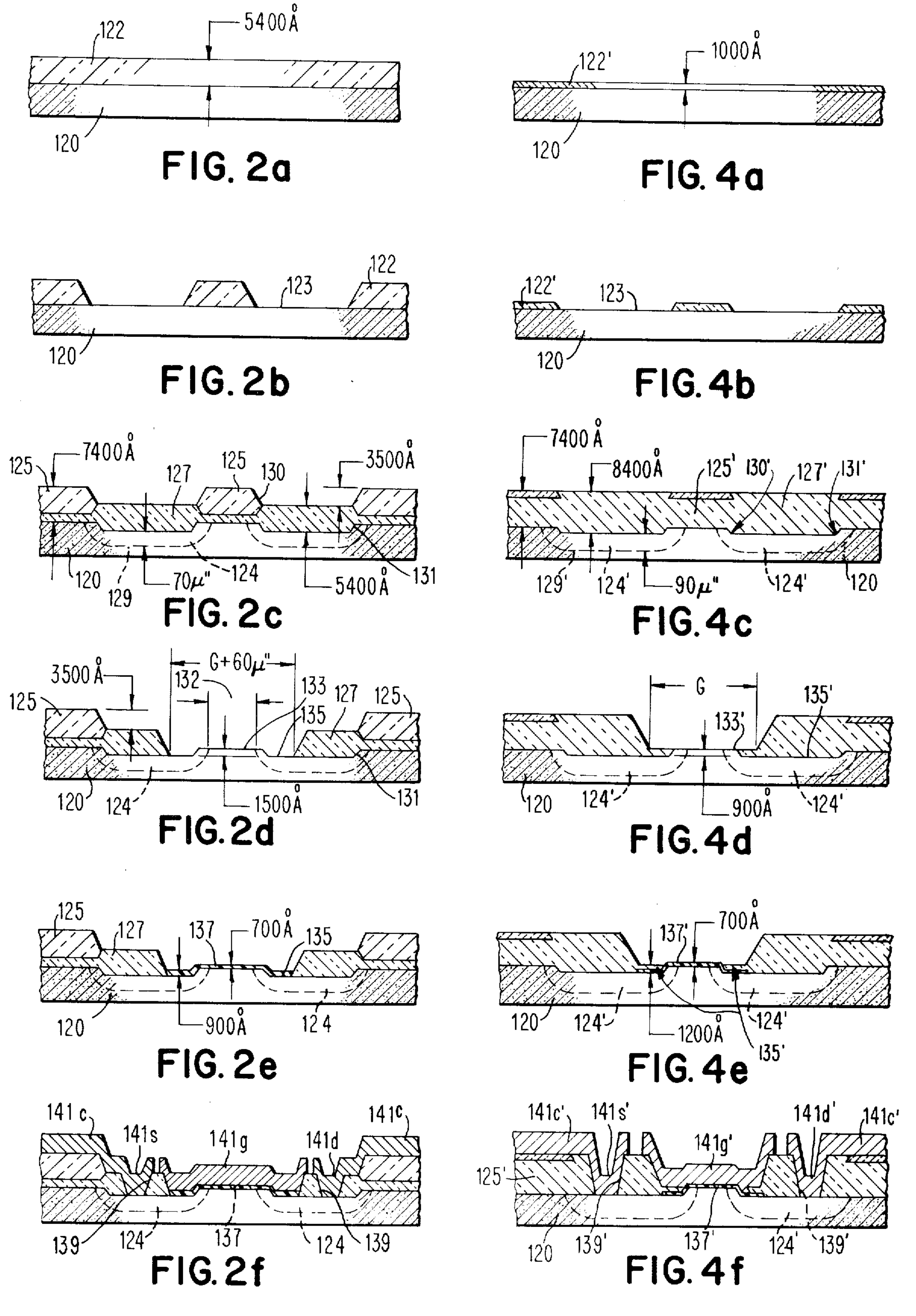
FIGS. 2A through 2F are a series of cross sections through a semiconductor wafer that show the structure of the wafer at different steps in the process of FIG. 1 in fabricating an FET.
FIGS. 4A through 4F are a series of cross sections through a semiconductor wafer that show the structure of the wafer at different steps in the process of FIG. 3 in fabricating an FET.

An operation 30 forms gate openings between the regions 124 (see FIG. 2D). An effective channel length ($L_{eff}$) 132 of 200 microinches exists in an area 133. $L_{eff}$ is the distance between adjacent terminating points of the diffused regions 124 or the channel length. Conventional photolithographic — masking — etching steps are utilized to expose the area 133 of the substrate 120. The field oxide 125 of the gate area 133 has a greater thickness than the diffused oxide 127 (see FIG. 2C). Etching the oxide 127 over the region 133 also etches away a portion of the oxide over the region 124 (see FIG. 2D) and it forms extension 135. The over etched extension of the region 133 is approximately the gate area (G) + 60 microinches into the region 124. The distance of over etching varies according to the etch, doped condition of the oxide and other factors.

An operation 32 fills the regions 133 and 135 with oxide to establish a gate insulator 137 for an FET device (see FIG. 2E). The oxide is formed in the regions 133 and 135 by well known processes which provide a controlled thickness for the region 133. Typically, the gate insulator oxide 137 is deposited to a thickness of 700 A.

An operation 34 forms openings 139 over the regions 124 by conventional photolithographic — masking — etching processes (see FIG. 2F). Alternatively, the openings 139 may be formed at the same time the gate area 133 is exposed.

An operation 36 deposits metallization, typically aluminum on the oxide coated surface of the wafer. After photolithographic — masking — etching steps, contacts 141*s*, 141*d*, gate electrode 141*g* and conductors 141*c* are formed on the device. The gate electrode 141*g* extends over the regions 124 due to the lateral extensions 135. Since the regions 124 are highly conductive under the gate electrode 141*g*, the gate capacitance is significantly increased and adversely alters the circuit characteristic of the FET device. Moreover, the non-planar surface of the oxide across the wafer results in more than one photoresist thickness. Different development characteristics occur for the photoresist in the operation 36. Because of the different photoresist development, the conductors 141*c* tend to broaden over the diffusion oxide 127 and possibly contact the metallization over the gate regions 137.

Figures 5A, 5B:
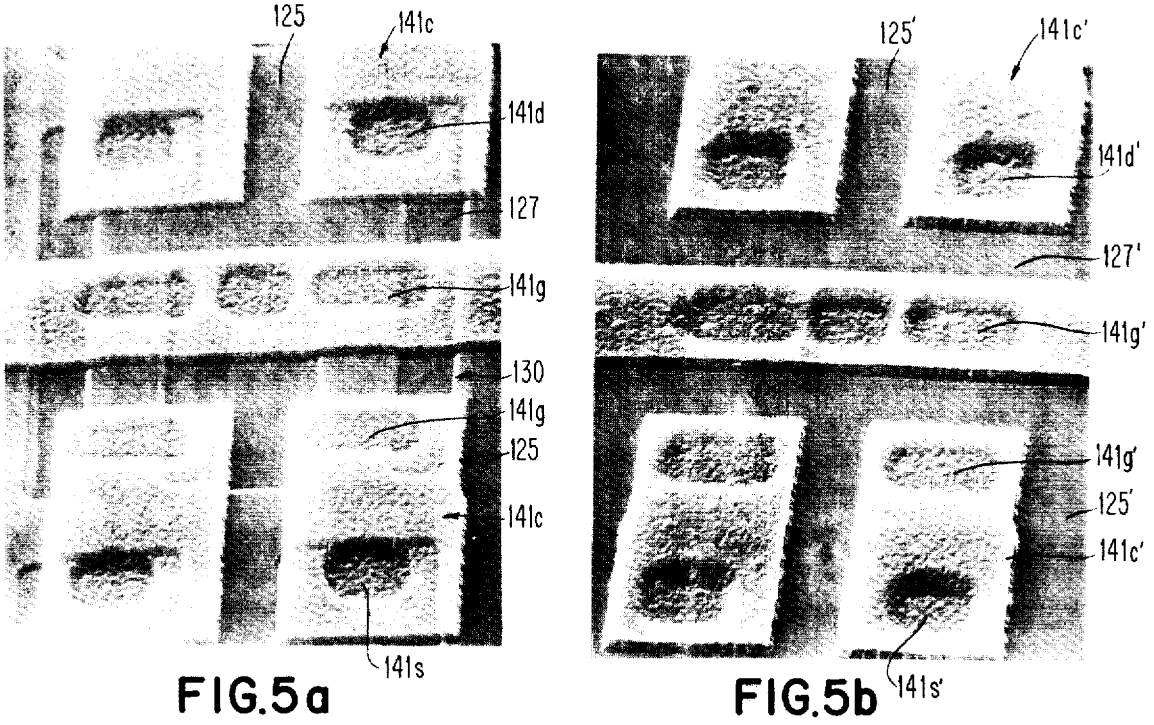
FIGS. 5A and B are actual photographs of a portion of the surface of a semiconductor wafer after processing by the processes of FIG. 1 and 3, respectively.

FIG. 5A shows the electrodes 141*s*, 141*d*, 141*g* and conductor 141*c*. Oxide step 130 (see FIG. 2C) is shown in FIG. 5A. Other elements in FIG. 5A are diffused oxide 127 and field oxide 125. The spacing between the electrodes 141*g* and 141*d*/ 141s is of the order of 175 microinches. The variations in the conductor widths has been found to be about 20 microinches wider on the diffusion oxide 127 than on the field oxide 125. Tolerances are associated with each of the conductors to prevent contact. Eliminating conductor broadening will permit more devices to be incorporated into the wafer.

Figure 3:
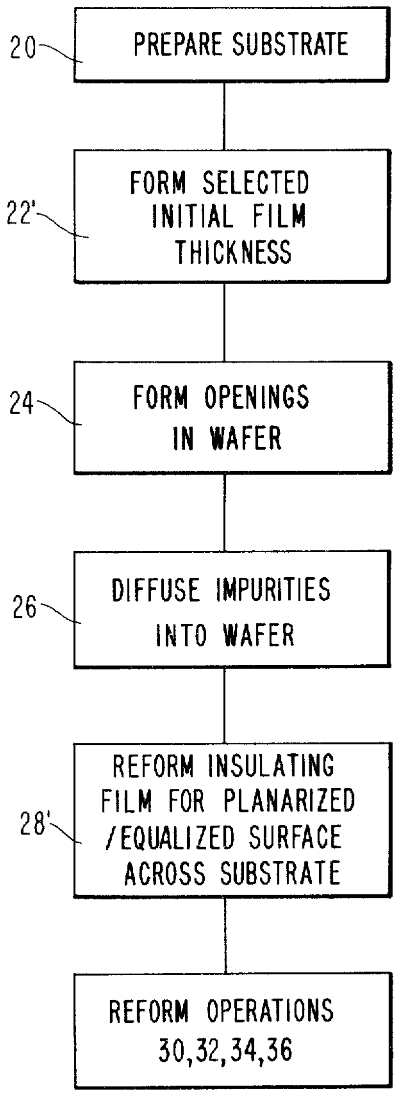
FIG. 3 is a flow diagram of a process for forming a semiconductor device with improved control of horizontal and vertical geometry following the principles of the present invention.

Correction of the foregoing problems is accomplished by using the process of FIG. 3. Process operations in FIG. 3 corresponding to those in FIG. 1 will have the same reference characters. Different process operations in FIG. 3 from those in FIG. 1 will have the reference character primed. The description of FIG. 3 will be described in conjuction with FIGS. 4A through 4F. The description will be limited to those operations which are different from those in FIG. 1.

Referring to FIG. 3 and FIGS. 4A through 4F, the operation 20, previously described, is performed. An insulating film 122' is formed on the substrate 120 in an operation 22' (see FIG. 4A). The insulation is chosen to be (1) a barrier or mask to impurities to be diffused into the substrate 120; (2) composed of a material that will provide a different growth rate than the doped substrate when the insulating film is reformed in a subsequent operation, and (3) a thickness that will result in a planar surface across the wafer or other configuration, e.g., uniform thickness after all processing operations have been completed.

For P type silicon substrates, where the diffusion impurity is boron, an insulating film of silicon dioxide having a thickness of about 1000 A achieves the foregoing film objectives. The insulating film may be more or less than 1000 A depending upon the subsequent processes employed in reforming the insulating film. In the case of N type substrates, where phosphorus is the dopant, a different thickness silicon dioxide film may be required. The electrical characteristics of the devices, which are given hereafter, will demonstrate that the 1000 A film will accomplish the objective of an effective mask to diffusion impurities. While silicon dioxide is a preferred insulating film other films are also possible. Obviously, films other than silicon-oxygen composition will require additional processing steps which complicate and increase the cost of fabricating semiconductor devices.

Preferably, the oxide film 122' is formed on a P type substrate, e.g., boron doped by thermally growing silicon dioxide in dry oxygen at 1000 C for about 240 minutes. The relatively thin oxide film does not require a wet steam cycle to achieve the desired thickness in a reasonable processing time. Growing the oxide film in dry oxygen results in an improved surface condition for the substrate or wafer.

The operation 24, previously described, is performed (see FIG. 4B). The silicon dioxide insulating film is reformed in an operation 28' and diffusion region 124' established (see FIG. 4C). The reoxidation occurs in a cycle of about (5) minutes dry oxygen; 125 minutes of wet steam and a final 5 minutes in dry oxygen. All reoxidation cycle steps are performed at a temperature of about 1000 C. The longer wet cycle in the operation 28' as compared to the operation 28 in FIG. 1, results in a diffusion oxide 127' being approximately 8400 A thick. Approximately 900 A of the oxide is within the substrate 120. The remainder is on the surface of the substrate 120 and matches the height of the extended field oxide film 125' which is about 7400 A. The operation 28', therefore, results in a planarized oxidized film entirely across the surface of the wafer 120. The junction 129' extends into the substrate about 90 microinches which is about 15 microinches more than that for the prior art device.

FIG. 4D shows the gate region G exposed after the etching operation 30. $L_{eff}$ for the device is about 200 microinches. Since the diffusion oxide 127' is about 1000 A thicker than the field oxide 125', only the gate region is etched to the silicon surface and not the diffusion region during the operation 30. Moreover, the tapered walls of the etched regions facilitates metallization in subsequent operation. In contrast, the stepped walls of the gate region in the prior art process, (see FIG. 2D) decreases the adhesion and reliability of the gate contact in the prior art device.

The thicker oxide over the diffused region 127' in the operation 32 results in a self-aligning feature for the gate oxide, as shown in FIG. 4E. The thicker oxide over the diffused region is due to the several hundred angstroms of the oxide being present at the on-set of the gate oxidation cycle and in part to the faster oxidation rate of the phosphorus diffused silicon over the diffused region 124'.

FIG. 4F shows the diffused (source and drain) and gate regions with metal contacts 141s', 141d' and 141g' after the operations 30, 32, 34 and 36 previously described in FIG. 1 and FIG. 2F. FIG. 4F also shows the conductor 141c' attached to the field oxide.

FIG. 5B shows the oxide films 125' and 127' which no longer have an oxide step 130 as in FIG. 5*a*. The absence of the oxide step 130 in FIG. 5B eliminates gate extension 135 (see FIG. 2D) due to over etching. Electrodes 141*s*', 141*d*', 141*g*' and conductor 141*c*' are also shown. The conductor 141*c*' connected to the electrodes 141*s*', 141*d*' and 141*g*' has increased separation relative to the corresponding conductors in FIG. 5A. Devices may be fabricated in the wafer at higher densities and improved reliability.

A comparison of the physical parameters of a prior art device (Col. b) and a device fabricated in accordance with the principles of the present invention (Col. c) is given below:

TABLE I

| (Physical Characteristics) | | | |
|---|---|---|---|
| (a) Parameter | (b) Prior Art | (c) Planarized | (d) Equalized |
| Initial Oxide (122) | 5400A | 1000A | 3000A |
| Field Oxide (125) | 7400 | 7400 | 7200 |
| Diffusion Oxide (127) | 5400 | 8400 | 7200 |
| Silicon Step (131) | 1500 | 900 | 1300 |
| Si $O_2$ Step (130) | 2000 | −1000 | 0 |
| Total Step (130 + 131) | 3500 | 0 | 1300 |
| $X_j$ (129) | 70u" | 90u" | 85u" |
| Gate Oxide Extension (135) | 30 | 0 | 0 |
| Alum. Line Broadening (not shown) (contact printing) | 10–15 | 0 | 0–5 |
| $L_{eff}$ (132) | 200 | 200 | 200 |

A comparison of electrical characteristics for a prior art device (Col. b) and a device fabricated in accordance with the principles of the invention (Col. c) is given below:

TABLE II

| (Electrical Characteristics) | | | |
|---|---|---|---|
| (a) Parameter | (b) Prior Art | (c) Planarized | (d) Equalized |
| Gamma 0.35 thin (um/v) | 26.8 | 26.2 | 27.4 |
| VTO5 0.35 thin (volts) | 0.932 | 1.223 | 0.847 |
| VTO5 0.35 thick (volts) | 19.62 | 19.7 | 18.30 |
| IL602 0.35 thin (na) | 12.51 | 0.6 | 1.14 |
| RS Diff. (ohms/□) | 15.5 | 11.3 | 13.5 |
| $L_{eff}$ (u-in.) | 187.7 | 215 | 198 |

The parameters listed in Table II are defined as follows:

| Parameter | Definition |
|---|---|
| Gamma 0.35 thin (um/v) | Normalized transconductance of a 700A thick gate oxide device to the equivalent value for a 200u" long device ($L_{eff}$). |
| VTO5 0.35 thin (volts) | The threshold voltage of the 200u" device ($L_{eff}$) with an applied substrate voltage of 5 volts. |
| VTO5 0.35 thick (volts) | The threshold voltage of the field oxide (7400A thick) with 200u" ($L_{eff}$) betwen diffusions, and 5 volts substrate bias. |
| IL602 0.35 thin (na) | Leakage current, source to drain, of 200u" ($L_{eff}$) 700 A device with 2 volts applied to the substrate, 6 volt difference between source anddrain. |
| RS Diff. (ohms/□) | Diffusion sheet resistance. |
| $L_{eff}$ (u-in.) | Effective channel length (electrical). |

The electrical comparison shows that the process changes required for planarization (Col. c) have not degraded the electrical performance of the devices.

While the invention has been described relative to achieving an insulating film having a planarized surface across the wafer 120, the process may be adjusted to have a film of other surface configuration. For example, the thickness of the film can be adjusted to be everywhere the same across the wafer or equalized. An equalized film configuration across the wafer may be achieved by forming an initial film thickness 122 of about 3000A instead of 1000A. All other operations described in FIG. 3 are the same for forming the equalized configuration. Tables I and II compare physical and electrical characteristics of prior art devices (Col. b) against equalized devices (Col. d). Other insulation configurations may be achieved by the invention. Each configuration is the result of the simultaneous solution of the film growth equations for each area of the wafer.

Figure 6A:
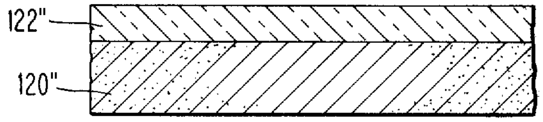
FIGS. 6A, B, and C are a series of cross sections through a semiconductor wafer that show the structure of the wafer at different steps in the process of FIG. 3 in fabricating a bipolar transistor.

While the invention has been described in relation to an FET process, the process is also applicable to bipolar integrated or discrete device fabrication. FIGS. 6A, B and C show a bipolar device being fabricated by the principles of the present invention. Elements in FIGS. 6A, B and C corresponding to those in FIGS. 4A thorugh F have the same reference characters but are double primed. Different elements will have new reference characters.

Figure 6B:
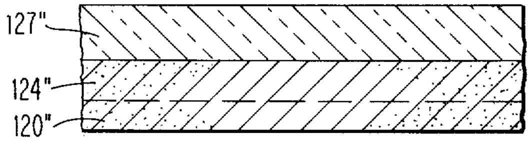
Figure 6C:
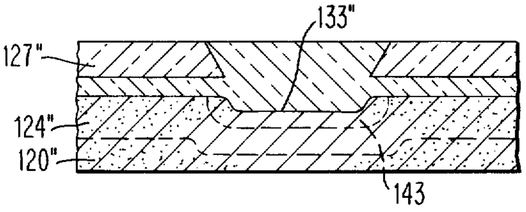

The structure shown is FIGS. 6A and 6B are fabricated in a similar manner to that described for the structures shown in FIGS. 4A thorugh 4C. The device in FIG. 6C is fabricated by forming an opening 133'' in a manner described in FIG. 4D. A diffusion is performed through the opening 133'' to establish a diffused region 143 within the region 124''. Where the region 124" is an N type region, formed by diffusing phosphorus, the region 143 is usually formed by diffusing boron impurities to convert the N type region back to a P type region. The oxide film is reformed over the region 143 in a manner corresponding to that described in Fib. 4C. The oxide growth on boron doped silicon is faster than oxide growth on intrinsic or oxide coated silicon. The W. A. Pliskin article, supra, indicates the oxidation for boron doped silicon should be performed between 920°C to 1200°C while that for phosphorus doped silicon should be performed below 1100°C. Obviously, the process parameters for the reoxidation cycle in FIG. 4C can be adjusted to achieve a planar or uniform oxide thickness across the surface of a bipolar device as in the case of a field effect transistor device.

It will be understood that the specific embodiment described herein are merely illustrative of the genral principles of the invention. Various modification of the invention are feasible without departing from the spirit and scope of the invention. That is, the method of the invention is also applicable to mesa type devices in addition to planar and double diffused types of N & P semiconductor wafers shown and described.

What is claimed is:

1. A process for fabricating semiconductor devices comprising the steps of:

a. depositing an initial insulating film on the surface of a semicondutor substrate of a first conductivity type,
b. forming openings in the insulating film to expose the substrate surface,
c. forming regions of a second conductivity type within the openings and in the substrate,
d. reforming the insulating film in the openings and entirely across the wafer to be of a substantially planar configuration, and,
e. forming an opening through the substantially planar insulating film to attach an electrode to the substrate.

2. The process of claim 1 wherein the insulating film is reformed within the openings and across the wafer to be of substantially the same thickness.

3. The process of claim 1 wherein the substrate is P type silicon and the initial insulating film is silicon dioxide having a thickness of about 1000A to serve as a diffusant mask.

4. The process of claim 3 wherein the initial oxide thickness of 1000A is formed by thermal growth in dry oxygen at 1000 C for about 240 minutes.

5. The process of claim 4 wherein the process of reforming the oxide film in the opening comprises a 5 minute dry oxygen thermal growth cycle followed by a 125 minute wet steam and a final (5) minute dry oxygen thermal growth cycle all at a temperature of about 1000°C.

6. The process of claim 2 wherein the substrate is of P type silicon and the insulating film is silicon dioxide having a thickness of about 3000A.

7. A process for fabricating semiconductor devices comprising the steps of:

a. depositing on a semiconductor substrate an initial insulating film of a selected thickness to achieve a final insulating film of a desired physical form,
b. forming an opening in the insulating film,
c. forming a diffused region in the semiconductor substrate and within the opening,
d. reforming the insulating layer in the opening and on the wafer as a final insulating layer having a substantially planar surface, and
e. forming an opening through the planar insulating film to attach an electrode to the substrate.

8. The process of claim 7 wherein the initial insulating film thickness is selected to be of the order of 1000 to 3000A.

9. The process of claim 8 wherein the initial insulating film thickness is selected to serve as a diffusant mask.

* * * * *